United States Patent [19]
Prabhakar

[11] Patent Number: 5,869,359
[45] Date of Patent: Feb. 9, 1999

[54] PROCESS FOR FORMING SILICON ON INSULATOR DEVICES HAVING ELEVATED SOURCE AND DRAIN REGIONS

[76] Inventor: Venkatraman Prabhakar, 40640 High St., Apt. 507, Fremont, Calif. 94538

[21] Appl. No.: 908,022

[22] Filed: Aug. 20, 1997

[51] Int. Cl.⁶ .................................................... H01L 21/84
[52] U.S. Cl. .................................................................. 438/149
[58] Field of Search ................................ 438/149, 300, 438/311, 151, 155, 347, 160; 257/347

[56] References Cited

U.S. PATENT DOCUMENTS

| | | | |
|---|---|---|---|
| 5,352,631 | 10/1994 | Sitaram et al. | 438/300 |
| 5,387,540 | 2/1995 | Poon et al. | 438/430 |
| 5,434,093 | 7/1995 | Chau et al. | |
| 5,461,243 | 10/1995 | Ek et al. | 257/190 |
| 5,545,579 | 8/1996 | Liang et al. | 438/160 |

OTHER PUBLICATIONS

Wolf et al., "Silicon Processing for the VLSI Era vol. 1:Prcess Technology" Lattice Press, Sunset Beach, CA USA. pp. 280–299, 1986 No month.

Wolf "Silicon Processing for the VLSI Era vol. 2:Process Integration" Lattice Press, Sunset Beach, CA USA. pp. 66–69, 1990 No month.

Primary Examiner—Charles Bowers
Assistant Examiner—Craig Thompson
Attorney, Agent, or Firm—William L. Paradice, III

[57] ABSTRACT

A dielectric layer is formed over an SOI layer and then masked and etched to define a trench. The sidewalls of the trench are thermally oxidized to form a layer of oxide thereon. A polysilicon gate is then formed within the trench. The layer of oxide laterally bounds the gate and thus serves a sidewall spacer for the gate. Dopants are implanted into portions of the SOI layer lying on opposite sides of the trench to form elevated source and drain regions. A layer of silicide such as, for instance, titanium silicide, may then be formed within surface portions of the elevated source and drain. The elevation of the source and drain allows silicon to be sufficiently sourced during formation of the silicide, thereby minimizing agglomeration within the silicide layer. The channel length of a semiconductor device fabricated using present embodiments is controlled by the thickness of the sidewall spacer.

18 Claims, 7 Drawing Sheets

PROCESS FOR FORMING SILICON ON INSULATOR DEVICES HAVING ELEVATED SOURCE AND DRAIN REGIONS

CROSS REFERENCE TO RELATED APPLICATION

This application is related to commonly owned U.S. patent application Ser. No. 08/915,076, entitled "PROCESS FOR FORMING SILICON ON INSULATOR DEVICES USING A NITRIDING AGENT", filed on Aug. 20, 1997.

BACKGROUND

1. Field of Invention

This invention relates generally to silicon-on-insulator (SOI) CMOS devices and specifically to processes for forming SOI devices having a low resistance.

2. Description of Related Art

Silicon-on-insulator (SOI) devices are those which are formed in a thin silicon layer which overlies an insulating layer. The insulating layer, in turn, overlies a second silicon layer. Fabricating integrated circuit (IC) devices in a thin silicon-on-insulator (SOI) layer, as opposed to fabricating such devices in a much thicker bulk silicon structure, allows for lower parasitic capacitances and for greater channel currents which, in turn, allows for faster speeds. The lower parasitic capacitances also allow for reduced substrate crosstalk and, thus, for reduced noise. In order to fully realize these advantages, the SOI layer within which IC devices are fabricated should be less than approximately 1000 Å so that the source and drain regions of these IC devices are proximate to the underlying insulating layer. Further, the source and drain regions of devices formed within an SOI layer should be shallow in order to minimize short channel effects.

Unfortunately, semiconductor devices fabricated in a thin SOI layer and having relatively shallow source and drain regions typically exhibit an unacceptably high series resistance between the source and drain regions. This high series resistance results in slower speeds and therefore may abrogate the superior speeds when using SOI technologies. In order to decrease the series resistance of such semiconductor devices, a layer of silicide is typically formed within the source and drain. The silicide material may be, for instance, Titanium Silicide ($TiSi_2$) or Cobalt Silicide ($CoSi_2$).

For instance, a layer of titanium silicide is formed within the source and drain of a transistor by first depositing a thin film of titanium over the surface of the transistor. The transistor is then thermally annealed in a nitrogen ambient at a temperature between approximately 400–700 degrees Celsius for approximately 10–200 seconds to induce reactions between titanium and silicon. Thus, titanium from within the deposited titanium layer and silicon from within the source and drain react to form a titanium silicide ($TiSi_x$) layer substantially within the source and drain. Since titanium does not significantly react with insulating materials such as, for instance, oxides and nitrides, portions of the titanium layer overlying sidewall spacers and field oxide regions remain in a metallic titanium state. These thermally induced reactions also produce a layer of titanium nitride over the transistor. The titanium nitride layer and un-reacted portions of the deposited titanium layer are removed during a subsequent etching step. The titanium silicide layer lying substantially within the source and drain of the transistor, which is left intact, increases the conductivity of the source and drain and, therefore, reduces the series resistance of the transistor. A second thermal annealing step converts the titanium silicide into a substantially stoichiometric composition. For instance, where the titanium silicide is in the form $TiSi_2$, the second annealing converts the $TiSi_2$ from a $C_{49}$ phase to a more conductive $C_{54}$ phase, thereby further reducing the series resistance of the transistor.

Forming a layer of silicide in the manner described above is, however, problematic if the semiconductor device is fabricated within a thin silicon layer, such as an SOI layer, which has a thickness of less than approximately 1000 Å. These thin silicon layers cannot source enough silicon during thermally induced reactions with titanium and, as a result, an undesirable amount of titanium agglomeration occurs within the resultant titanium silicide layer. The agglomeration of titanium decreases the conductivity of the silicide layer which, as discussed above, produces an undesirable increase in the series resistance of a transistor. The agglomeration of titanium may also degrade the performance and reliability of the transistor.

Increasing the thickness of the underlying silicon layer has been found to reduce the agglomeration of titanium during formation of titanium silicide. However, since increasing the thickness of the silicon layer undesirably increases parasitic capacitances therein, such an approach undesirably involves a difficult trade-off between maximizing the conductivity of the silicide layer and minimizing parasitic capacitances within the silicon layer. In response thereto, another approach has been proposed in which conventional methods of forming an elevated source and drain are applied to the fabrication of semiconductor devices formed in thin silicon layers such as, for instance, an SOI layer. The junction depths of the resultant elevated source and drain are increased, while preserving the thickness portions of the silicon layer lying between the elevated source and drain, i.e., the channel region. The deeper source and drain reduce the agglomeration of titanium during formation of titanium silicide layers therein. Since the thickness of other portions of the silicon layer are not increased, parasitic capacitances within the silicon layer are not significantly increased.

In this approach, a layer of gate oxide is first grown over an SOI layer. A layer of polysilicon is then deposited and patterned to form a control gate of the transistor. After sidewall spacers are formed in a well known manner, portions of the gate oxide overlying portions of the SOI layer where the source and drain will be formed are removed, thereby exposing these portions of the SOI layer. Next, an epitaxial layer of silicon is selectively grown over these exposed portions of the SOI layer and then doped using, for instance, ion implantation, to a desired dopant concentration. The resultant source and drain are formed substantially within the epitaxial layer and, thus, are "elevated" with respect to the gate. The elevated source and drain are then silicided, as described above, to reduce the series resistance of the transistor. Since the elevated source and drain lie substantially above the original SOI layer, a greater amount of silicon is available during formation of the silicide layer within the elevated source and drain. As a result, the titanium agglomerates to a much lesser extent, thereby increasing the conductivity of the silicide layer and, thus, further decreasing the series resistance of the transistor.

Unfortunately, such a method of forming an elevated source and drain of a transistor which is fabricated on a thin SOI layer is not only expensive but also is very difficult to control. Specifically, the thickness and quality of the epitaxial layer grown over portions of the SOI layer tend to vary between wafer runs, thereby undesirably resulting in device specification inconsistencies and reliability problems.

In another approach for forming elevated source and drain regions of a transistor, such as that disclosed in U.S. Pat. No. 5,434,093, issued on Jul. 18, 1995 to Chau et al, a dielectric layer is first formed over the substrate. A portion of the dielectric layer is removed using a suitable etchant, thereby forming a trench within the dielectric layer. After a polysilicon gate and associated sidewall spacers are formed within the trench, the dielectric layer is removed, thereby exposing portions of the underlying silicon substrate. Source and drain regions are formed within these exposed portions of the substrate. Since the trench may be etched into the substrate, the source and drain regions are elevated with respect to the gate.

The disadvantage of techniques such as that disclosed in the Chau et al patent is that the channel length of devices formed in accordance thereof is determined by the photo-lithographic and etching process used. Thus, the precision with which channel length may be controlled is limited by alignment tolerances and minimum dimensions of photo-lithography and etching techniques.

SUMMARY

A novel method is disclosed which not only reduces the agglomeration of titanium during formation of silicided regions within elevated source and drain regions of an SOI device but which also simplifies fabrication of such devices. In accordance with one embodiment of the present invention, a dielectric layer is formed over an SOI layer and etched to define a trench. The sidewalls of the trench are thermally oxidized to form a layer of oxide thereon. A polysilicon gate is then formed within the trench. The layer of oxide, formed by thermally oxidizing the side walls of the trench, serves as a sidewall spacer for the gate. Dopants are implanted into portions of the SOI layer lying on opposite sides of the trench to form elevated source and drain regions. In some embodiments, a layer of silicide such as, for instance, titanium silicide, is formed within surface portions of the elevated source and drain. The elevation of the source and drain allows silicon to be sufficiently sourced during silicide formation, thereby minimizing agglomeration within the silicide layer, while not adversely affecting parasitic capacitances within the SOI layer.

The channel length of a semiconductor device fabricated in accordance with present embodiments is determined by the thickness of the sidewall spacer. The thickness of the sidewall spacer, in turn, is controlled by the thermal oxidation of the side walls of the trench. Since the thickness of a sidewall spacer formed by thermal oxidation may be controlled with greater precision than the thickness of a sidewall spacer formed using conventional photo-lithography and etching techniques, the channel length of devices formed according to present embodiments may be controlled to a much greater extent than conventional processes allow. The resulting improved tolerance with which the channel length may be controlled allows present embodiments to be employed in next generation fabrication technologies, i.e., sub-0.5 micron technologies.

DETAILED DESCRIPTION

Principles of the present invention are described below in the context of forming elevated source and drain regions of a fully depleted SOI device for illustrative purposes only. It is to be understood that present embodiments are equally applicable to partially depleted SOI devices as well as to devices formed in a bulk silicon substrate. Accordingly, embodiments of the present invention should not be construed as limited to specific examples provided below.

Figure 1:
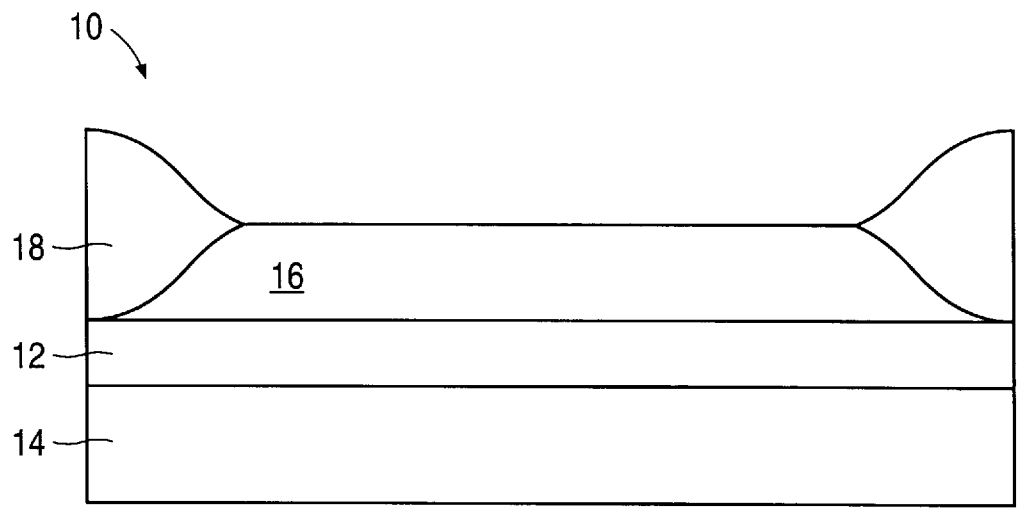
FIG. 1 is a cross-sectional view of a partially completed semiconductor device illustrating, in one embodiment of the present invention, the formation of elevated source and drain regions within a thin silicon-on-insulator (SOI) layer.

Referring now to FIG. 1, an SOI structure 10 includes an insulation layer 12 interposed between a silicon substrate 14 and a fully depleted silicon-on-insulator layer (SOI) 16. Insulating layer 12, which may be formed of, for instance, $SiO_2$, is between approximately 50–2000 Å thick. Substrate 14 is between approximately 50–2000 $\mu$m thick, and SOI layer 16 is between approximately 1000–2000 Å thick. Field oxide regions 18 are preferably formed using a suitable local oxidation of silicon (LOCOS) technique, but may in other embodiments be formed using a planarized technology such as, for instance, trench isolation.

Figure 2:
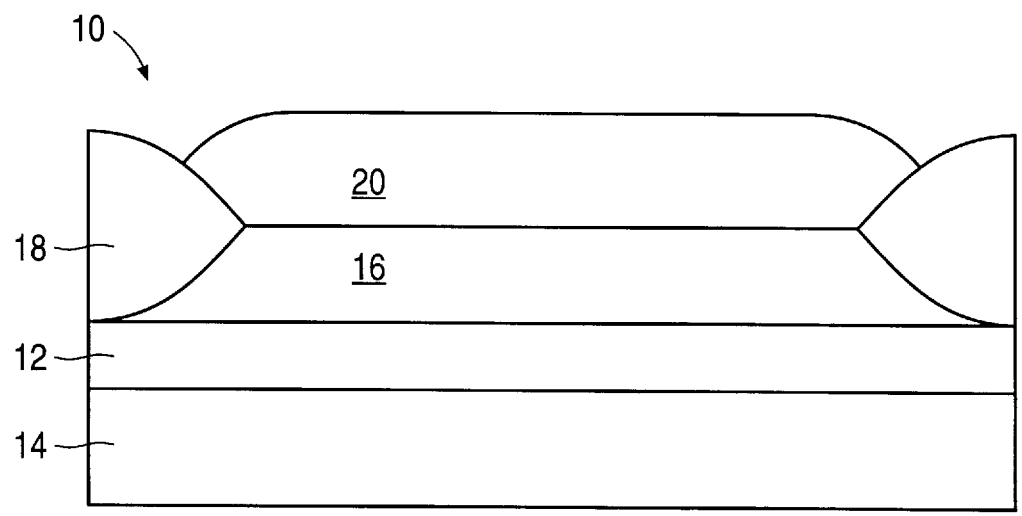
FIG. 2 is a cross-sectional view of a structure upon which planarized SOI devices may be formed in accordance with another embodiment of the present invention.

In some embodiments of the present invention, the SOI layer is between approximately 300–1000 Å thick. In these embodiments, a layer 20 of either amorphous silicon or poly silicon between approximately 500–2000 Å thick is deposited over SOI layer 16, as illustrated in FIG. 2. Silicon layer 20 may be either doped or un-doped, depending upon desired operating characteristics. For simplicity, present embodiments are described herein with reference to the structure illustrated in FIG. 1 only. It is to be understood, however, that present embodiments are equally applicable to the structure illustrated in FIG. 2.

Figure 3:
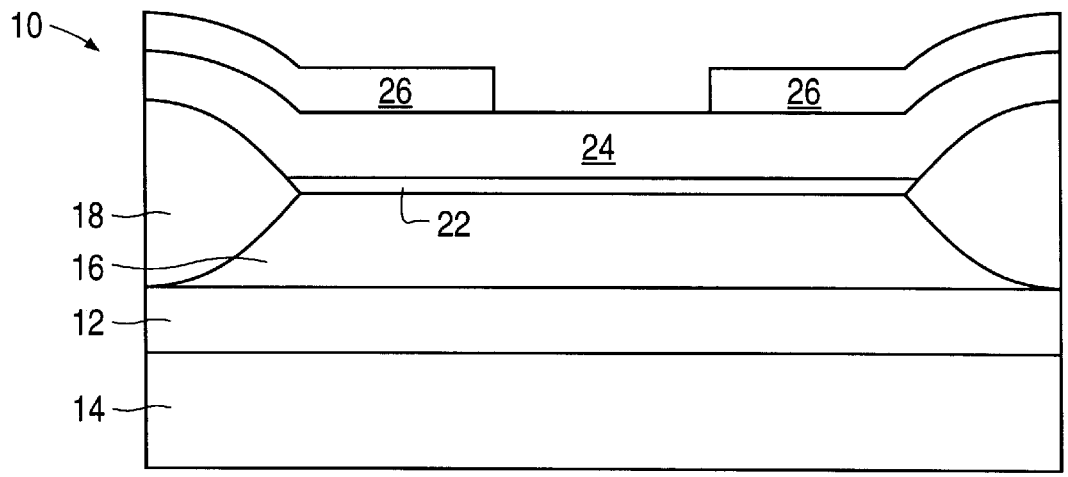
FIG. 3 is a cross-sectional view of the structure of FIG. 1 illustrating the formation of a dielectric layer and a masking layer.

A thin layer 22 of pad oxide between approximately 50–300 Å thick is thermally grown over SOI layer 16, as illustrated in FIG. 3. Pad oxide layer 22 may not be necessary if a sufficiently thick (50–300 Å) residual layer of oxide remains from previous masking and etching steps. A dielectric layer 24 having a thickness of between approximately 1000–8000 Å is deposited over pad oxide layer 22. Layer 24 may be any suitable dielectric material including, but not limited to, silicon nitride, silicon oxide, silicon oxinitride, Borosilicate Glass (BSG), or Phosphosilicate Glass (PSG). A layer 26 of suitable photo-resist is then formed and patterned, as shown in FIG. 3, to allow for the subsequent formation of a trench within layers 24, 22, and 16. In those embodiments in which a silicon layer is deposited over a thin SOI layer, e.g., deposited layer 20 (see FIG. 2), the trench may extend only within the amorphous silicon layer 20.

Figure 4:
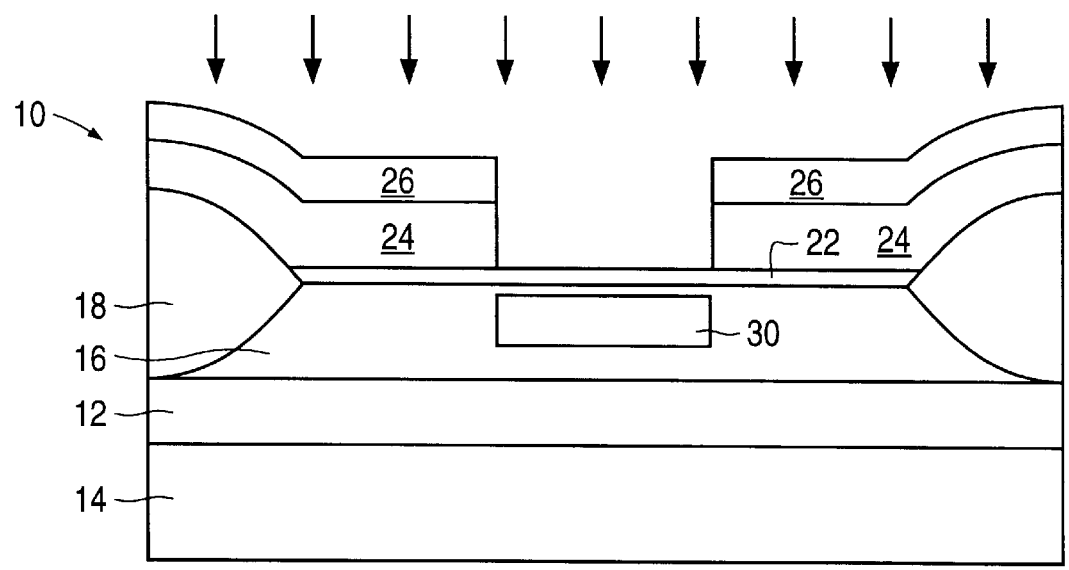
FIG. 4 is a cross-sectional view of the structure of FIG. 1 illustrating the etching of a trench within the dielectric layer and subsequent formation of an etch-stop layer.

Using photo-resist layer 26 as a mask, an anisotropic dry etch removes an exposed portion of dielectric layer 24, thereby forming a trench 28, as shown in FIG. 4. The etchant does not remove a significant amount of oxide layer 22. Preferably, an etch-stop layer 30 is utilized within SOI layer 16. In some embodiments, etch-stop layer 30 is formed by implanting a suitable n type dopant species, such as, for instance, Arsenic (As), Antimony (Sb), or Phosphorous (P) or a suitable p type dopant species, such as, for instance, Indium (In), Boron (B), Boron Fluoride ($BF_2$). Etch-stop layer 30 may also be formed by pre-amorphising SOI layer 16 by implanting heavy ions such as, for instance, Germanium (Ge) or Silicon (Si). In still other embodiments, etch-stop layer 30 is formed by implanting into SOI layer 16 a material such as, for instance, Helium (He), Hydrogen (H), Argon (Ar), Oxygen (O), and Nitrogen (N). In some embodiments, a top surface of etch-stop layer 30 is contiguous with the top surface of SOI layer 16. In those embodiments which employ a timed etch, etch-stop layer 30 is not necessary.

Figure 5:
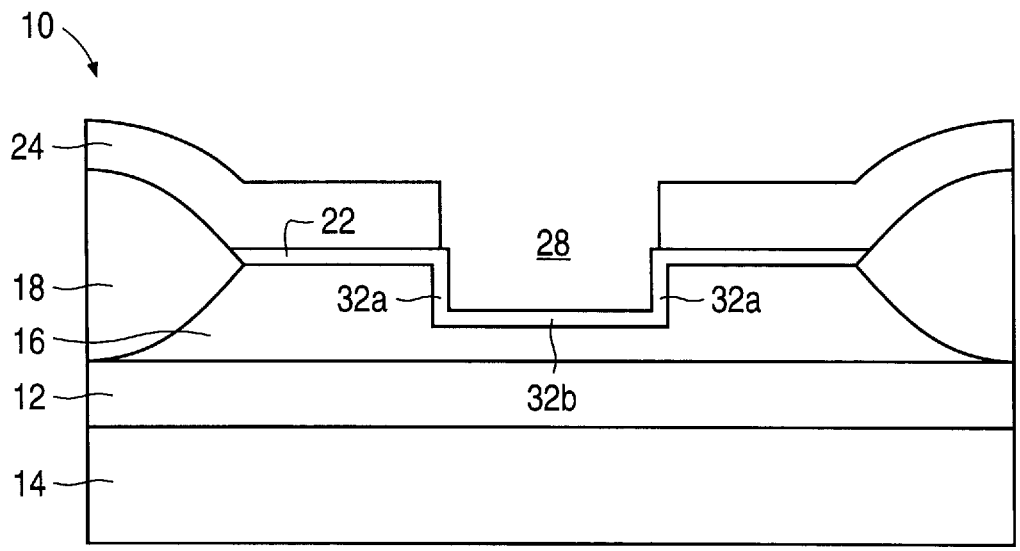
FIG. 5 is a cross-sectional view of the structure of FIG. 1 illustrating the etching of the trench into the SOI layer, the thermal growth of an oxide layer within the trench, and the subsequent removal of the masking layer.
Figure 6:
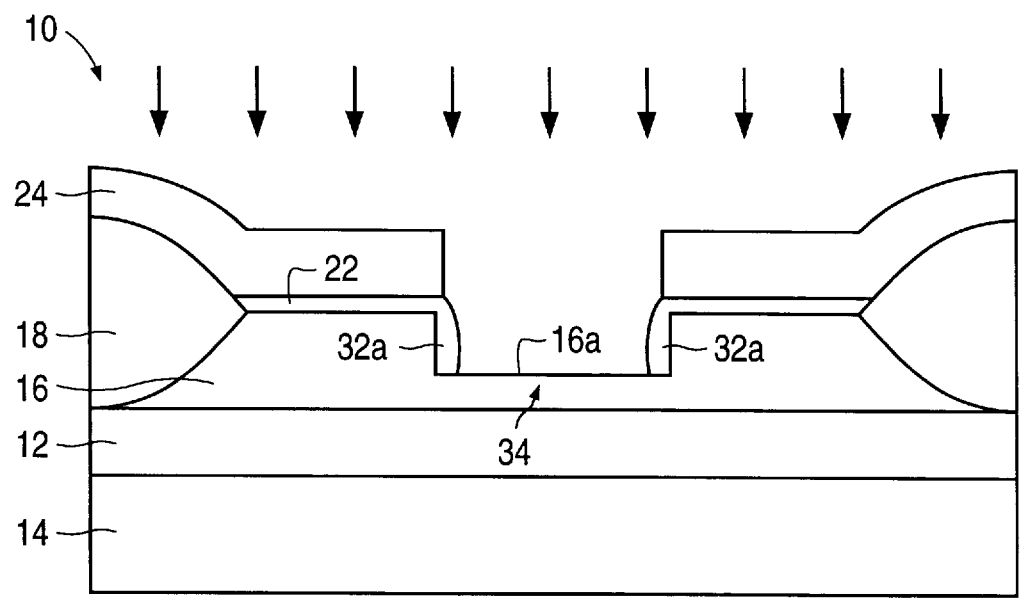
FIG. 6 is a cross-sectional view of the structure of FIG. 1 illustrating the formation of a channel implant.

Again using layer 26 as a mask, a suitable dry etchant is employed to remove the exposed portion of oxide layer 22 and underlying portions of SOI layer 16, thereby extending trench 28 into SOI layer 16, as illustrated in FIG. 5. The final depth of trench 28 may vary and is determined by the location, thickness, and composition of the etch-stop layer 30 shown in FIG. 4. Where it is desired to form fully depleted transistors within SOI layer 16, trench 38 should be of a depth such that portions of SOI layer 16 underlying trench 28 are preferably between 300–1000 Å. Where only partially-depleted transistors are formed within SOI layer 16, trench 28 may be shallower, as required by desired device operating characteristics.

The sidewalls and bottom surface of trench 28 are thermally oxidized to form contiguous oxide layers 32a and 32b where, as illustrated in FIG. 5, oxide layer 32a is formed on the sidewall of trench 28 and oxide layer 32b is formed on the bottom surface of trench 28. The final thickness of oxide layer 32a, which serves as a sidewall spacer for a gate subsequently formed within trench 28, determines the effective width of the trench 28 and, thus, determines the final length of a channel region subsequently formed beneath trench 28. A well known anisotropic dry etching step is used to remove oxide layer 32b, thereby exposing a surface 16a of SOI layer 16. Preferably, this etching step does not significantly affect the thickness of oxide layer 32a. A thin layer of sacrificial oxide between approximately 100–200 Å (not shown for simplicity) may be thermally grown on surface 16a of SOI layer 16 in order to protect the crystalline structure of SOI layer 16 during subsequent channel implants. Suitable dopants are implanted into portions of SOI layer 16 underlying exposed surface 16a according to a well known process, thereby forming an enhanced channel region 34. The particular species of the channel implant dopants, as well as the energy and dosage of such dopants, are determined in a conventional manner to achieved desired operating characteristics. For instance, in one embodiment, Boron ions are implanted at an energy of approximately 10 keV and a dosage of approximately $5E12$ ions/cm$^2$. The sacrificial oxide layer (not shown) may then be removed using a suitable timed wet etch. Preferably, the timed wet etch is performed in a manner which removes minimal amounts of oxide layer 32a.

Figure 7:
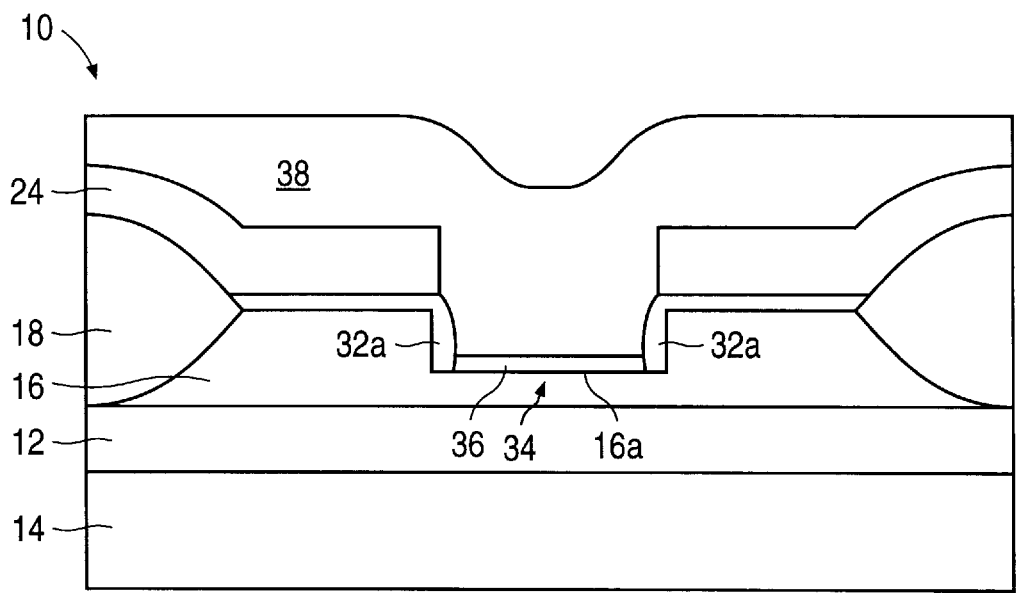
FIG. 7 is a cross-sectional view of the structure of FIG. 1 illustrating the deposition of a polysilicon layer.
Figure 8A:
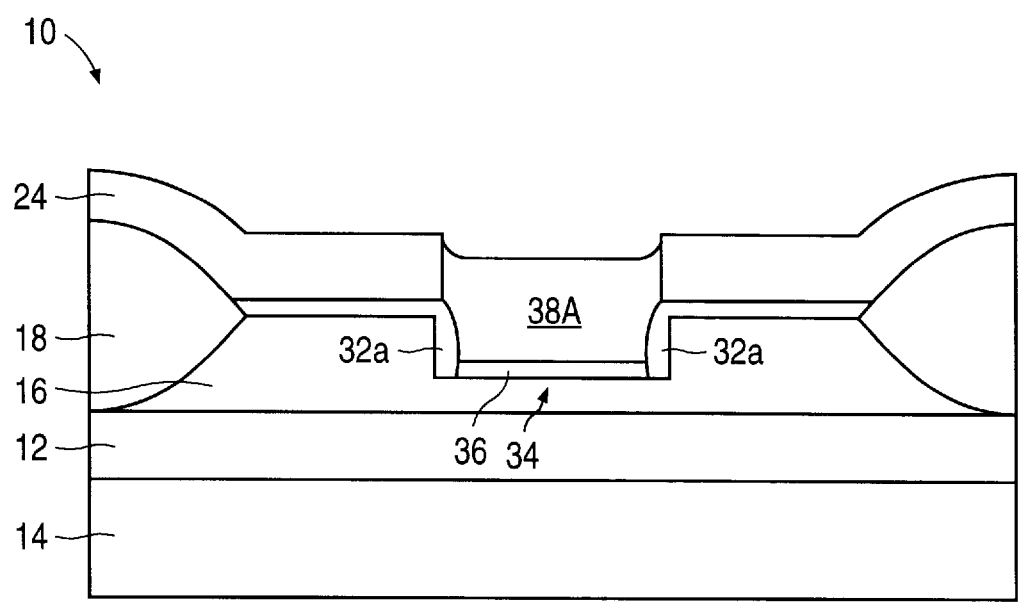
FIGS. 8A–8D are cross-sectional views of the structure of FIG. 1 illustrating the formation of gates in accordance with several embodiments of the present invention.
Figure 8B:
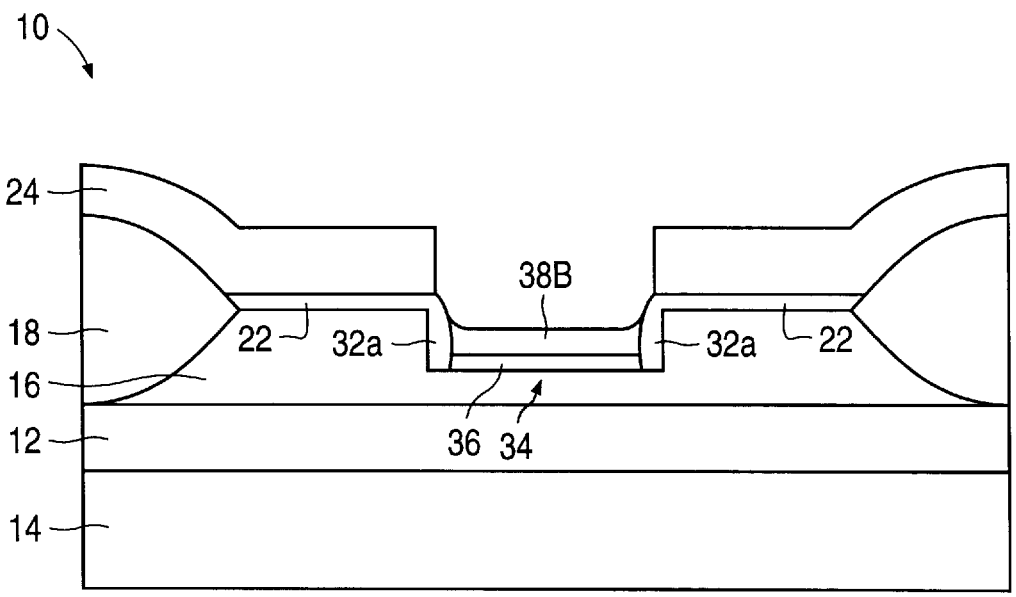
Figure 8C:
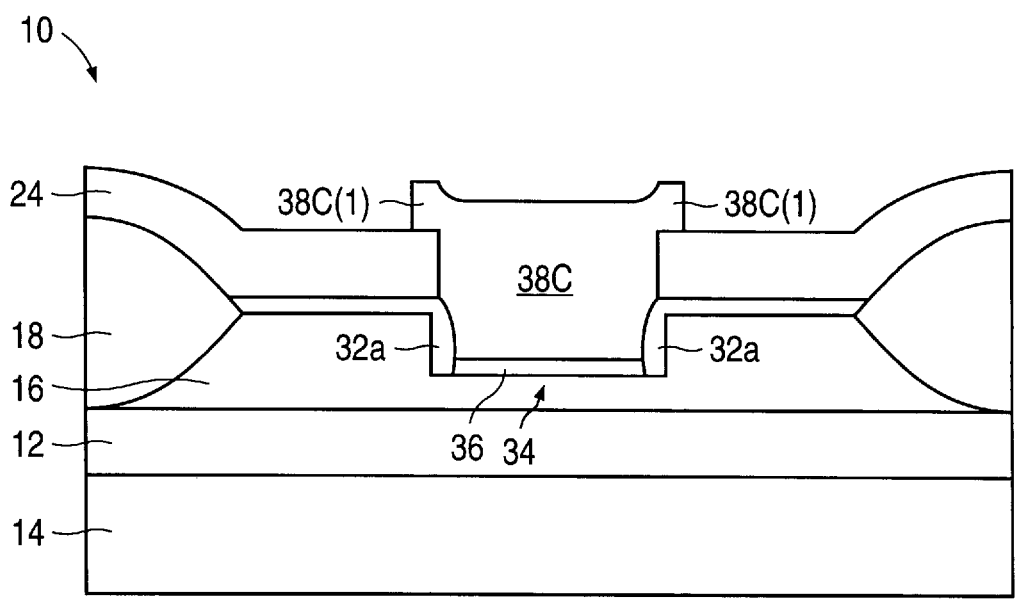
Figure 8D:
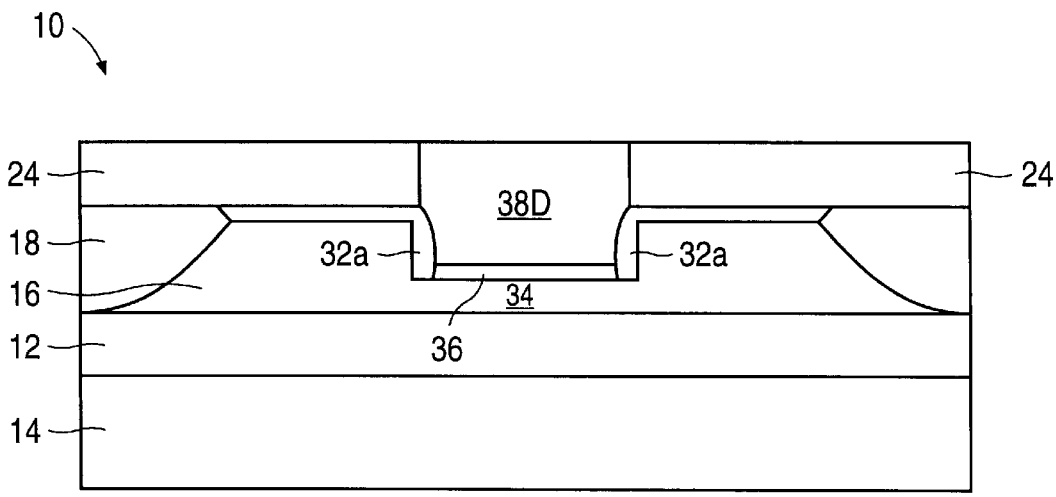

A layer 36 of gate oxide approximately 20–100 Å thick is formed on exposed surface 16a of SOI layer 16, as illustrated in FIG. 7. A layer of polysilicon 38 is then deposited over the top surface of structure 10. Polysilicon layer 38 is then etched using a suitable dry etching step so as to form a control gate 38A, as illustrated in FIG. 8A. Note that in the embodiment shown in FIG. 8A, control gate 38A is substantially flush with dielectric layer 24. In another embodiment, the duration of this etching step may be increased so as to result in a much thinner control gate 38B which is substantially flush with oxide layer 22, as illustrated in FIG. 8B. In other embodiments, a masking layer (not shown) is used in connection with the etching of polysilicon layer 38 so as to result in a control gate 38C having portions which lie above a top surface of dielectric layer 24, as illustrated in FIG. 8C. In these embodiments, the lip portion 38C(1) of control gate 38C should extend over dielectric layer 24 a minimal distance (1) to avoid undesirable parasitic capacitances and (2) so as to inadvertently mask portions of source and drain regions subsequently formed within SOI layer 16. FIG. 8D illustrates a control gate 38D fabricated in accordance with the present invention using a suitable planarized process such as, for instance, chemical mechanical polishing (CMP). Where a CMP process is employed, isolation oxide regions 18 should also be formed using a planarized process such as, for instance, trench isolation, as further illustrated in FIG. 8D. For simplicity, the remainder of the discussion refers to the structure illustrated in FIG. 8A, although it is to be understood, of course, that present embodiments are equally applicable to the control gate structures depicted, for instance, in FIGS. 8B–8D.

Figure 9:
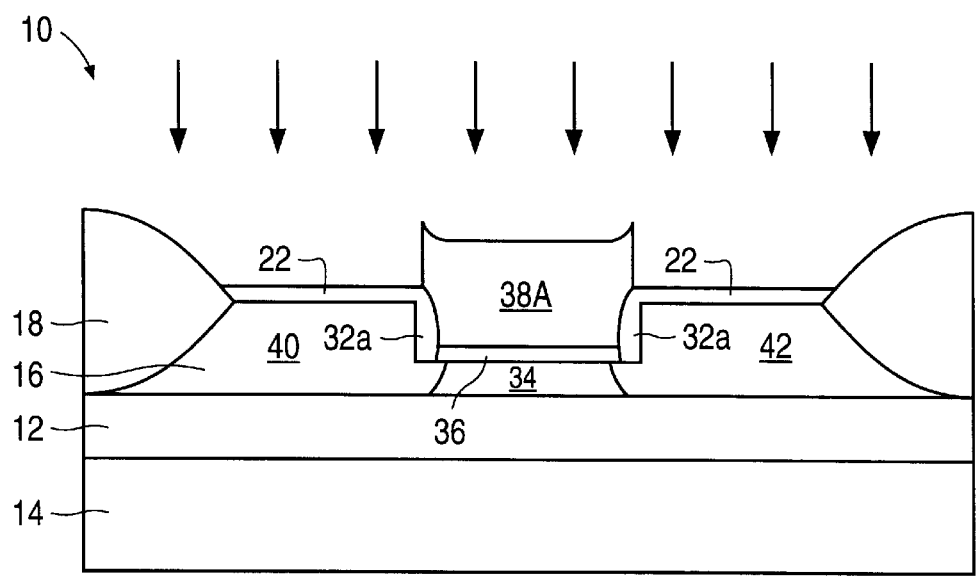
FIG. 9 is a cross-sectional view of the structure of FIG. 1 illustrating the formation of elevated source and drain regions and simultaneous doping of the gate.

Referring now to FIG. 9, dielectric layer 24 is removed using a suitable wet or dry etch. Oxide layer 22 is preferably left substantially intact to prevent damage to underlying portions of SOI layer 16 during subsequent source and drain implants. Suitable dopants are then implanted into structure 10 to form self-aligned elevated source 40 and drain 42 regions of either PMOS or NMOS devices, as illustrated in FIG. 9. Note that this implant also dopes control gate 38A, thereby increasing the conductivity of control gate 38A. The diffusion depths of source 40 and drain 42 are determined, in part, by the thickness of SOI layer 16. In other embodiments, double implant species may be employed during the formation of source 40 and drain 42 regions. For instance, Arsenic (As) and Phosphorus (P) may be implanted together to form n type source and drain regions, while Boron (B) and Boron Fluoride ($BF_2$) may be implanted together to form p type source and drain regions.

The energy levels, dosage, and activation drives of the implant are selected so as to uniformly dope control gate 38A and, in addition, to minimize damage to control gate 38A, source 40, and drain 42 resulting from the implant. The species of the implant may be a suitable n type or p type dopant, depending upon the desired majority carrier type and other desired operating characteristics.

Figure 10:
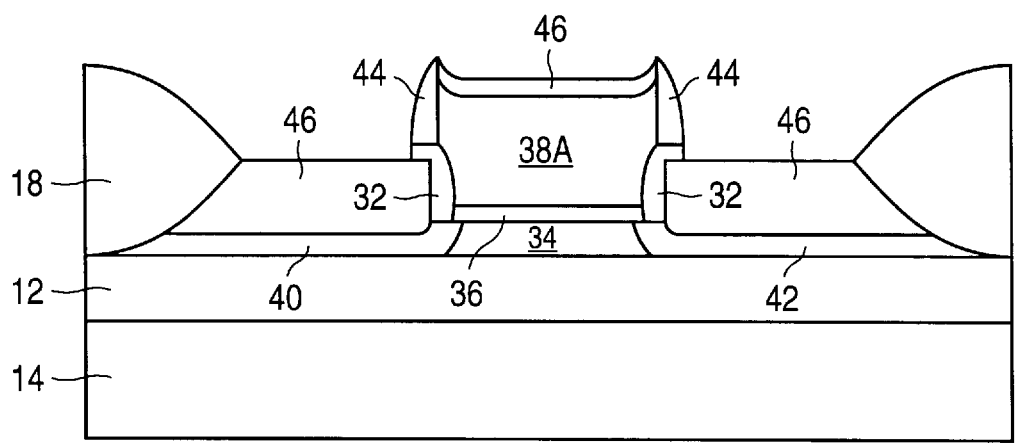
FIG. 10 is a cross-sectional view of the structure of FIG. 1 illustrating the formation of a silicide layer within the elevated source and drain.

Sidewall spacers 44 are formed in a conventional manner, as shown in FIG. 10. Although preferably silicon dioxide, sidewall spacers 44 may be any suitable insulating material including, for example, silicon nitride. A layer of silicide 46 such as, for instance, titanium silicide ($TiSi_2$) or cobalt silicide ($CoSi_2$), is formed within surface portions of source 40, drain 42, and control gate 38A. As discussed above, silicide layer 46 further increases the conductivity of source 40, drain 42, and control gate 38A, thereby further reducing the series resistance between source 40 and drain 42. Forming elevated source 40 and drain 42 regions as described above allows more silicon to be available during thermally induced reactions between silicon and titanium, thereby reducing the agglomeration of titanium during formation of silicide layer 46.

In some embodiments, a tungsten silicide ($WSi_2$) layer is formed within control gate 38A, thereby resulting in a polysilicon-$WSi_2$ stack, or polycide, gate 38A. In some embodiments, silicide layer 46 is formed using a conventional salicide process, e.g., a self-aligned silicide process. However, in preferred embodiments, silicide layer 46 is formed in a manner described in the commonly owned and co-pending patent application entitled "Process for Forming Silicon on Insulator Devices Using a Nitriding Agent", incorporated herein by reference.

For example, that commonly owned patent application teaches that in forming a titanium silicide layer 46, the top surface of structure 10 is exposed to a nitrogen ambient prior to the deposition of titanium. The nitrogen reacts with silicon from within source 40, drain 42, and gate 38A, thereby forming a nitrided silicon layer on the top surface of structure 10. A layer of titanium is then deposited over the nitrided silicon layer. A rapid thermal annealing performed at approximately 400–700 degrees Celsius for approximately 10–200 seconds induces reactions between the deposited titanium and silicon from within source 40, drain 42, and gate 38A, as well from within the underlying nitrided silicon layer, to produce a layer of titanium silicide ($TiSi_x$) and a layer of titanium nitride (TiN). Recall that titanium does not significantly react with insulating material during this thermal annealing step.

Un-reacted portions of the deposited titanium layer, as well as the titanium nitride layer, are removed using a selective wet etching process. A second rapid thermal annealing step is performed between approximately 600–900 degrees Celsius for approximately 10–200 seconds to convert the titanium silicide into a substantially stoichiometric composition. Thus, where the titanium silicide is of the form $TiSi_2$, the second thermal annealing step converts the titanium silicide from a $C_{49}$ phase to a more conductive $C_{54}$ phase. The nitrogen introduced into the silicon source 40 and drain 42 regions prior to the deposition of titanium promotes a more uniform reaction between titanium and silicon, thereby further minimizing the agglomeration of titanium within silicide layer 46.

The fabrication of an SOI structure such as, for instance, structure 10, in accordance with the present invention is advantageous over SOI structures formed in a conventional manner. Present embodiments allow for greater control over the channel length of transistors having elevated source and drain regions and which are formed in an SOI layer. Referring again to FIG. 5, the width of trench 28, and thus the width of the control gate 38A subsequently formed therein, is determined by the final thickness of oxide layer 32a. Since the channel length of a transistor is determined by the width of its gate, the length of channel 34 of structure 10 is determined by the thickness of oxide layer 32a. Accordingly, the length of channel 34 is precisely controlled by manipulating the oxidation of SOI layer 16.

In contrast, the channel length of devices formed using conventional fabrication techniques is determined by the photo-lithography and etching process employed, thereby undesirably limiting the precision of the channel length. Thus, since the tolerances with which the thermal oxidation of silicon can be controlled are less than the critical dimension of conventional photo-lithography techniques, present embodiments allow greater control over channel length. This greater control over channel length not only allows for the fabrication of superior semiconductor devices, in terms of performance and reliability, but also allow fabrication techniques in accordance with the present invention to be immediately available to next generation fabrication technologies, i.e., sub-0.5 $\mu$m technologies.

For instance, the sides of SOI layer 16 which define trench 28 may be thermally oxidized, as described above, to within approximately 0.002 $\mu$m. Thus, the channel length of devices formed according to the present invention, such as channel 34 of structure 10, have a margin of error of approximately 0.004 $\mu$m (2 times 0.002 $\mu$m). In contrast, the final width of sidewall spacers formed using conventional techniques, such as that disclosed in the above-referenced U.S. Pat. No. 5,434,093 to Chau et al, may be controlled to within only approximately 0.05 $\mu$m, thereby allowing the channel length to be controlled to within only approximately 0.1 $\mu$m.

The ability to more accurately control channel length also allows for the formation of shorter channel lengths which, in turn, can result in as much as a 10–30% increase in current drive over SOI devices having elevated source and drain regions which are formed using conventional methods.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

I claim:

1. A method for forming on a semiconductor substrate a semiconductor device having elevated source and drain regions, said method comprising the steps of:

(a) forming a dielectric layer overlying said substrate;

(b) removing a portion of said dielectric layer and a portion of said substrate substantially underlying said portion of said dielectric layer to define a trench having a side surface and a bottom surface, wherein portions of said substrate underlying said trench are thinner than portions of said substrate not underlying said trench;

(c) thermally oxidizing said side surface of said trench to form a sidewall spacer, said sidewall spacer having a thickness;

(d) depositing a layer of polysilicon over said semiconductor device; and (e) etching said polysilicon layer to form a gate of said semiconductor device, said gate lying substantially within said trench, wherein a channel region underlying said trench and extending between said elevated source and drain regions has a length which is determined by the thickness of said sidewall spacer.

2. The method of claim 1, further comprising the step of:

before step (a), forming an amorphous silicon layer overlying said substrate, wherein step (b) further comprises etching a portion of said amorphous silicon layer substantially underlying said portion of said dielectric layer to define said trench.

3. The method of claim 2, wherein a bottom surface of said trench lies within said amorphous silicon layer.

4. The method of claim 2, wherein a bottom surface of said trench lies within said substrate.

5. The method claim 2, wherein said substrate comprises a silicon-on-insulator layer.

6. The method of claim 2, wherein said amorphous layer comprises polysilicon.

7. The method of claim 2, wherein said amorphous layer comprises a silicon-germanium alloy.

8. The method of claim 1, further comprising the step of:
   (b1) removing a portion of said dielectric layer;
   (b2) forming an etch-stop layer within a portion of said substrate underlying said portion of said dielectric layer; and
   (b3) removing said portion of said substrate containing said etch-stop layer to define a trench having a side surface and a bottom surface, said etch-stop layer determining a depth of said trench, wherein portions of said substrate underlying said trench are thinner than portions of said substrate not underlying said trench.

9. The method of claim 8, wherein said etch-stop layer is formed by implanting ions.

10. The method of claim 9, wherein said ions comprise p type dopants.

11. The method of claim 9, wherein said ions comprise n type dopants.

12. The method of claim 9, wherein said ions comprise heavy-ion amorphising implants.

13. The method of claim 9, wherein said ions are selected from the group consisting of helium, hydrogen, argon, nitrogen, and oxygen.

14. The method of claim 1, further comprising the step of:
   before step (d), implanting dopants into a portion of said substrate underlying said trench to form a channel region.

15. The method of claim 1, further comprising the step of:
   (f) implanting dopants into said device to form said elevated source and drain regions of said semiconductor device.

16. The method of claim 15, further comprising the steps of:
   (g) introducing a nitriding agent into said elevated source and drain regions to form a nitrided silicon layer substantially within said elevated source and drain regions;
   (h) depositing a layer of a metal over said semiconductor device;
   (i) annealing said semiconductor device to induce reactions between said metal and silicon from within said nitrided silicon layer and silicon from within said elevated source and drain regions, thereby forming a layer of silicide lying substantially within said elevated source and drain regions and forming a layer of metal nitride; and
   (j) removing said layer of metal nitride and un-reacted portions of said layer of metal, while leaving intact said silicide layer, wherein said silicide layer reduces a resistivity of said elevated source and drain regions.

17. The method of claim 1, further comprising the step of:
   (c1) etching said bottom surface of said trench to remove any oxide thereon.

18. The method of claim 17, further comprising the step of:
   (c2) growing a thin layer of gate oxide on said bottom surface of said trench.

* * * * *